United States Patent
Agarwal et al.

(10) Patent No.: US 11,757,434 B2
(45) Date of Patent: Sep. 12, 2023

(54) HIGH PERFORMANCE FAST MUX-D SCAN FLIP-FLOP

(71) Applicant: Intel Corporation, Santa Clara, CA (US)

(72) Inventors: Amit Agarwal, Hillsboro, OR (US); Steven Hsu, Lake Oswego, OR (US); Simeon Realov, Portland, OR (US); Mahesh Kumashikar, Bangalore (IN); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/711,638

(22) Filed: Apr. 1, 2022

(65) Prior Publication Data
US 2022/0224316 A1   Jul. 14, 2022

Related U.S. Application Data

(63) Continuation of application No. 16/726,020, filed on Dec. 23, 2019, now Pat. No. 11,296,681.

(51) Int. Cl.
| | | |
|---|---|---|
| *H03K 3/00* | (2006.01) | |
| *H03K 3/037* | (2006.01) | |
| *G01R 31/3177* | (2006.01) | |
| *H03K 3/038* | (2006.01) | |
| *H03K 19/20* | (2006.01) | |
| *H03K 3/3562* | (2006.01) | |

(52) U.S. Cl.
CPC ....... *H03K 3/0372* (2013.01); *G01R 31/3177* (2013.01); *H03K 3/038* (2013.01); *H03K 3/35625* (2013.01); *H03K 19/20* (2013.01)

(58) Field of Classification Search
CPC ... H03K 3/0372; H03K 3/35625; H03K 3/038
See application file for complete search history.

(56) References Cited

U.S. PATENT DOCUMENTS

| | | | | |
|---|---|---|---|---|
| 5,719,878 A | * | 2/1998 | Yu | G01R 31/318555 327/202 |
| 5,926,520 A | * | 7/1999 | Yano | G11C 16/06 377/80 |

(Continued)

OTHER PUBLICATIONS

Non-Final Office Action dated Dec. 23, 2019 from U.S. Appl. No. 16/726,020, 10 pages.

(Continued)

*Primary Examiner* — Tuan T Lam
(74) *Attorney, Agent, or Firm* — Schwabe, Williamson & Wyatt, P.C.

(57) ABSTRACT

A fast Mux-D scan flip-flop is provided, which bypasses a scan multiplexer to a master keeper side path, removing delay overhead of a traditional Mux-D scan topology. The design is compatible with simple scan methodology of Mux-D scan, while preserving smaller area and small number of inputs/outputs. Since scan Mux is not in the forward critical path, circuit topology has similar high performance as level-sensitive scan flip-flop and can be easily converted into bare pass-gate version. The new fast Mux-D scan flip-flop combines the advantages of the conventional LSSD and Mux-D scan flip-flop, without the disadvantages of each.

17 Claims, 8 Drawing Sheets

(56) References Cited

U.S. PATENT DOCUMENTS

| | | | |
|---|---|---|---|
| 7,437,634 | B2 | 10/2008 | Jaber et al. |
| 8,352,815 | B2 | 1/2013 | Frederick, Jr. |
| 8,356,217 | B2 | 1/2013 | Yamanaka et al. |
| 9,385,698 | B2 | 7/2016 | Krishnamurthy et al. |
| 9,928,337 | B2 | 3/2018 | Gothi et al. |
| 2007/0001731 | A1 | 1/2007 | Branch et al. |
| 2007/0168792 | A1 | 7/2007 | Barowski et al. |
| 2008/0016417 | A1* | 1/2008 | Sinha .................. G11C 29/48 714/726 |
| 2008/0169857 | A1 | 7/2008 | Hwang et al. |
| 2008/0218233 | A1 | 9/2008 | Yamamoto et al. |
| 2008/0313485 | A1 | 12/2008 | Frank et al. |
| 2013/0169332 | A1* | 7/2013 | Rahman ................ H03K 3/356 327/208 |
| 2017/0085253 | A1 | 3/2017 | Cao et al. |
| 2019/0089338 | A1 | 3/2019 | Kim et al. |
| 2019/0198491 | A1 | 6/2019 | Do et al. |

OTHER PUBLICATIONS

Notice of Allowance dated Dec. 3, 2021 from U.S. Appl. No. 16/726,020, 8 pages.
International Search Report and Written Opinion dated Jan. 6, 2021 for International Application No. PCT/US2020/051258, 16 pages.

* cited by examiner

HIGH PERFORMANCE FAST MUX-D SCAN FLIP-FLOP

RELATED APPLICATIONS

This application is a continuation of U.S. patent application Ser. No. 16/726,020, entitled "HIGH PERFORMANCE FAST MUX-D SCAN FLIP-FLOP" filed on Dec. 23, 2019, and claims priority to the Ser. No. 16/726,020 application. The entire contents of the Ser. No. 16/726,020 application is incorporated herein by reference.

BACKGROUND

High performance designs for modern microprocessors, discrete graphics, digital signal processors (DSP's), and hardware accelerators in laptops, and servers are increasingly becoming an important factor due to the advent of new applications such as artificial intelligence (AI), machine learning, autonomous driving, security/crypto currency. At the same time, there is desire to reduce silicon cost, improve time-to-market (TTM), and to slow scaling cadence of process technology node. These requirements need to be met while meeting the stringent frequency and/o performance targets and power and/or leakage budgets. One important standard cell and fundamental building block of any digital integrated circuit is a flip-flop, which is required to store state in any sequential logic. Each latch or flip-flop is expected include testability circuit hooks (also referred to as scan logic), which are merely used for testing (e.g., design for test (DFT)). These scan logic can consume, for example, approximately 70% of a standard cell size of a latch or can be part of critical delay limiting frequency. As such, the scan logic is a significant overhead.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
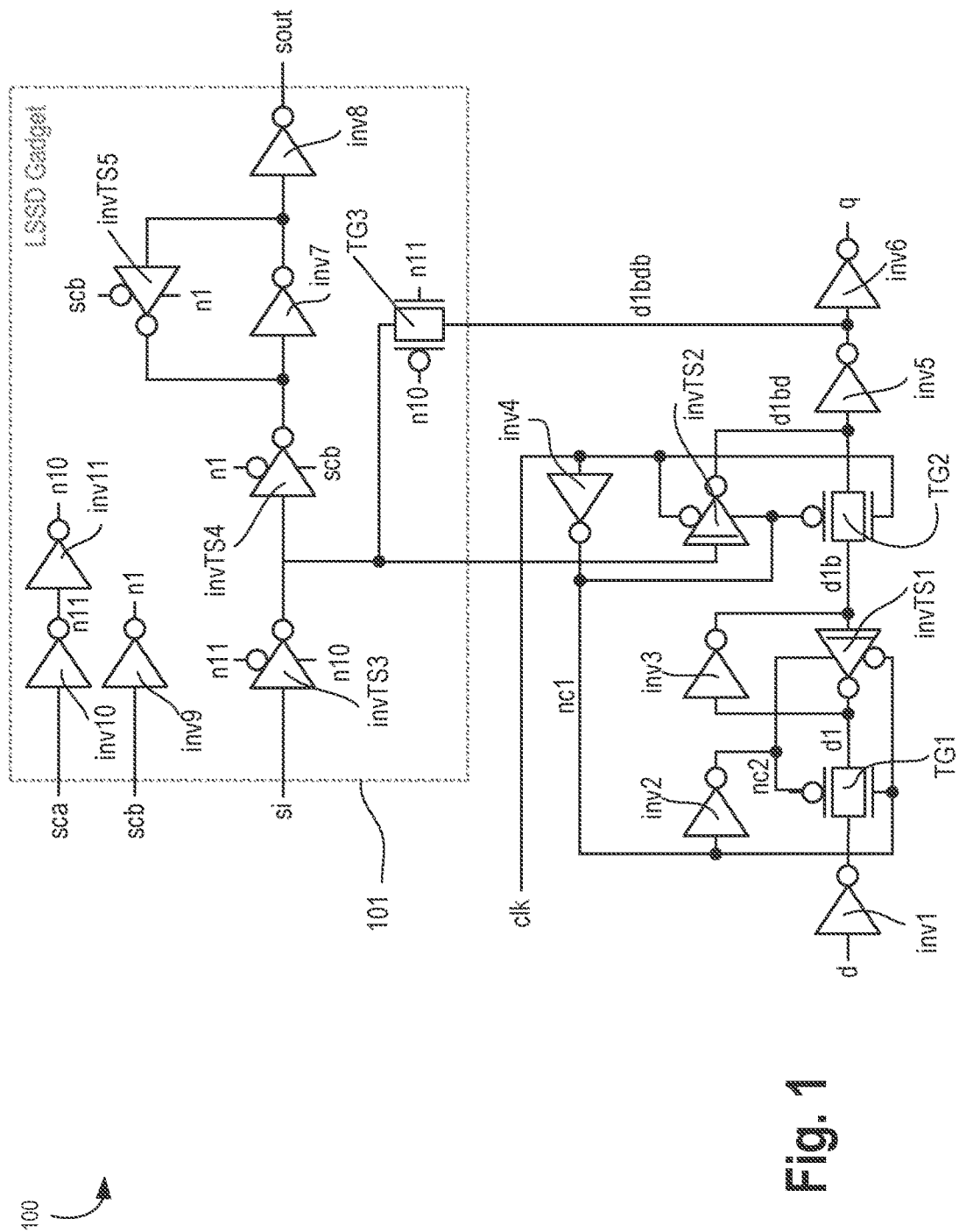
FIG. 1 illustrates a level sensitive scan design.

Various embodiments disclose a novel fast Mux-D scan flip-flop (FF), which bypasses a traditional input data scan multiplexer to the master keeper side path, removing delay overhead of a traditional Mux-D scan circuit topology. The fast Mux-D scan FF is compatible with simple scan methodology of Mux-D scan, while preserves smaller area and small number of inputs/outputs compared to traditional Mux-D scan circuit topologies. Since the scan mux is not in the forward critical path of the FF, the circuit topology has similar high performance as a level sensitive scan design (LSSD) scan FF, and can be easily converted into bare pass-gate version. The fast Mux-D scan flip-flop of various embodiments combines the advantages of the conventional LSSD and Mux-D scan flip-flop, without the disadvantages of each.

There are many technical effects of various embodiments. For example, bypassing the scan mux to the master keeper side path removes delay overhead of Mux-D scan topology. The design of the fast Mux-D scan FF is compatible with simple scan methodology of a Mux-D scan FF. The FF of various embodiments results in smaller area and small number of inputs/outputs as a traditional Mux-D scan FF. The FF of various embodiments has similar high performance as LSSD scan flip-flop. The FF of various embodiments can be converted into bare pass-gate version for higher performance. The FF of various embodiments can be organized into a vectored FF topology. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/− 10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a level sensitive scan design (LSSD) 100. LSSD 100 consists of a scan gadget 101, which is coupled to the side of the slave keeper and does not come in between flip-flop (FF) forward critical delay path. The FF consists of inverters inv1, inv2, inv3, inv4, inv5, and inv6, tristate inverters invTS1, invTS2, transmission pass gate TG1 and TG2, nodes data (d), d1, d1*b*, d1*bd*, d1*bdb*, nc1, nc2, and clock (clk) coupled as shown. Scan gadget 101 consists of inverters inv7, inv8, inv9, inv10, inv11; tristate inverters invTS3, invTS4, invTS5, nodes sca (scan input clock a), scb (scan input clock b), n11, n10, n1, and sout coupled as shown. In LSSD 100, since there is no extra gate in the forward path, LSSD 100 can also be easily converted into bare pass-gate version for higher performance. However, scan gadget 101 is large in area and requires complex scan methodology, two scan clocks and larger number of input/output pins.

Figure 2:
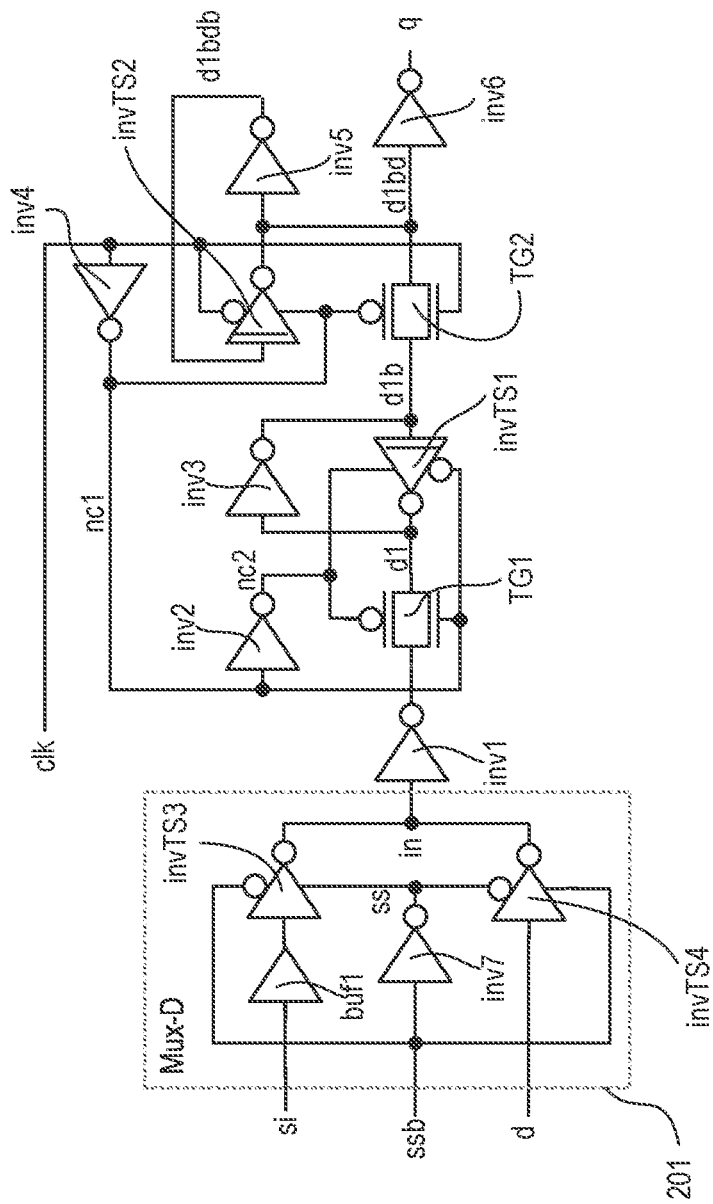
FIG. 2 illustrates an input data multiplexer (Mux-D) scan flip-flop (FF).

FIG. 2 illustrates an input data multiplexer (Mux-D) scan flip-flop (FF) 200. Mux-D scan design inserts a multiplexer (Mux) 201 at the input of the flip-flop, which selects either data d, or scan si input using select signal ssb. Here, the suffix 'b' indicates logic or signal inversion while suffix indicates a delay without logic inversion. For example, ssb is an inverse of ss, and d1*bd* is a delayed and non-inverted version of d1*b*. Here, signal names and node names are interchangeably used. For example, the name "ss" may refer to signal ss or node ss, depending on the context of the sentence.

The FF consists of inverter inv1, inv2, inv3, inv4, inv5, and inv6; tristate inverters invTS1, invTS2; transmission gates TG1, TG2, nodes d1, d1*b*, d1*bd*, d1*bdb*, nc1, clock clk, and output q coupled as shown. Mux-D 201 consists of inverter inv7, buffer buf1, and tristate inverters invTS3 and invTS4, nodes ss, in, si, ssb, and d coupled as shown. Mux-D 201 is in the forward critical delay path of the flip-flop resulting in slower performance (than without it) and cannot be converted into bare pass-gate version. However, low overhead of Mux-D scan 201 in terms of area and simple scan with merely one scan clock and small number of input/output pins, makes this design more attractive and easy to implement.

Figure 3A:
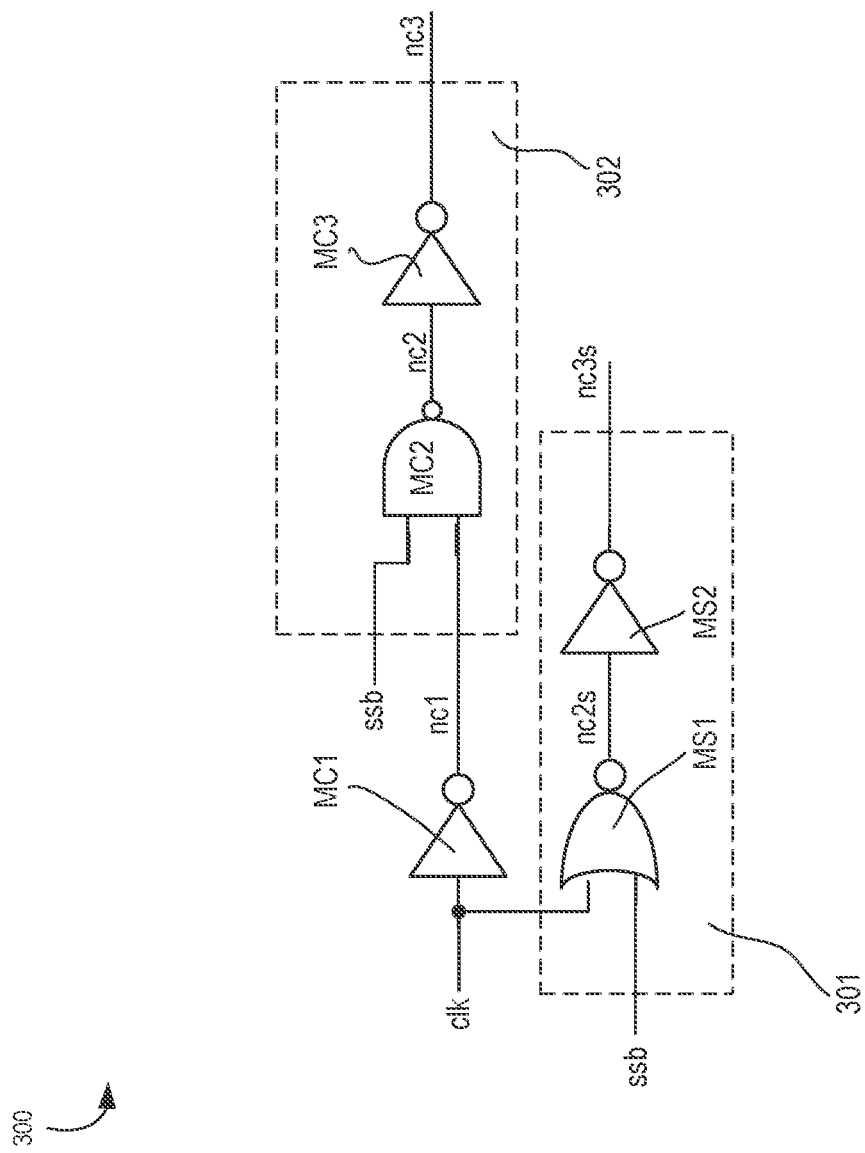
FIG. 3A illustrates a scan enabled clock logic to control a fast Mux-D scan FF, in accordance with some embodiments.

FIG. 3A illustrates a scan enabled clock logic 300 to control a fast Mux-D scan FF, in accordance with some embodiments. Logic 300 comprises inverter MC1 that receives clock clk as input; OR logic 301; and AND logic 302. OR logic 301 comprises NOR gate MS1 and inverter MS2 coupled as shown. The inputs to OR logic 301 are clock clk and scan enable ssb. The output of OR logic 301 is nc3*s*. AND logic 302 comprises NAND MC2 and inverter MC3. The inputs to AND logic 302 are the output nc1 of inverter MC1 and scan enable ssb. The output of AND logic 302 is nc3.

Figure 3B:
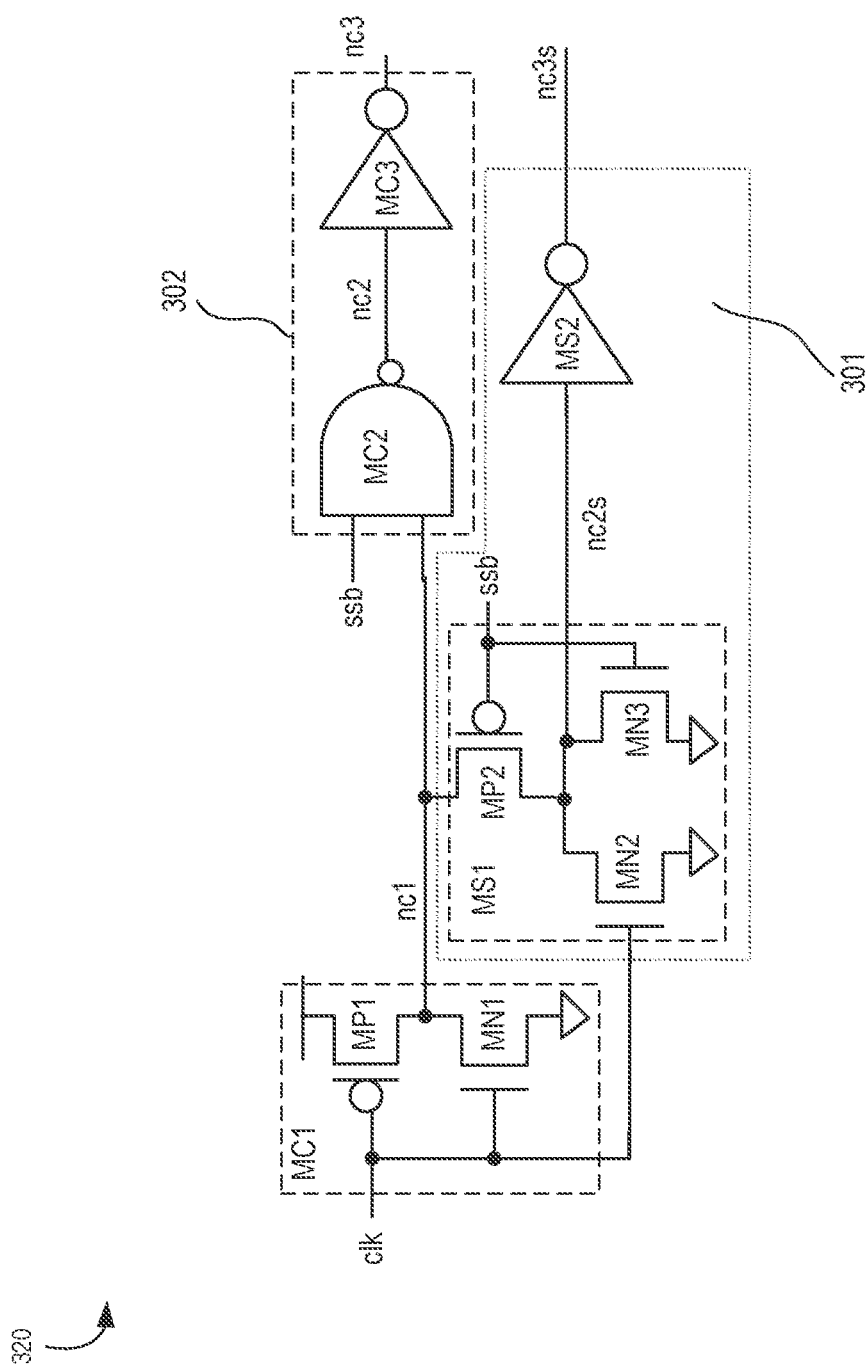
FIG. 3B illustrates a schematic of FIG. 3A, in accordance with some embodiments.

FIG. 3B illustrates schematic 320 of FIG. 3A, in accordance with some embodiments. Inverter MC1 comprises p-type transistor MP1 and n-type transistor MN1. The NOR gate MS1 comprises p-type transistor MP2 and n-type transistors MN2 and MN3.

Figure 4:
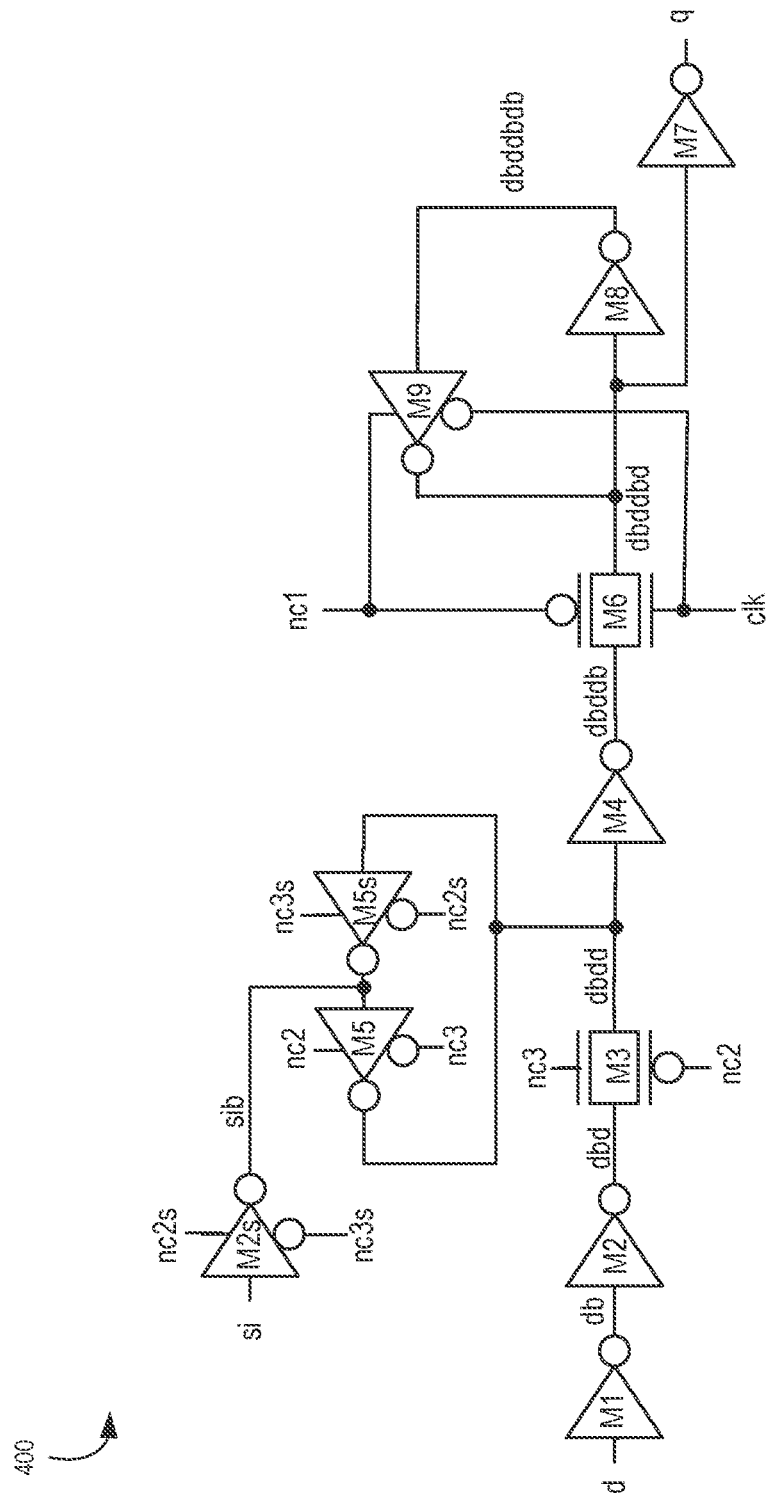
FIG. 4 illustrates a schematic of a fast Mux-D scan FF controlled by the scan enabled clock logic, in accordance with some embodiments.

FIG. 4 illustrates schematic of a fast Mux-D scan FF 400 controlled by the scan enabled clock logic, in accordance with some embodiments. Fast Mux-D scan FF 400 comprises inverters M1, M2, M4, M7, and M8; transmission pass gates M3 and M6, tristate inverters M2*s*, M5, M5*s*, and M9; nodes d, db, dbd, dbdd, dbddb, dbddbd, dbddbdb, si, sib, and output q. The transmission gates M3 and M6, and the tristate inverters are controlled by signals generated by scan enabled clock logic 300/320.

In various embodiments, data 'd' and scan "si" inputs of the Mux scan (FIG. 2) is split into two separate master paths. Scan input si is bypassed into the master keeper side path (comprising tristate inverters M2*s* and M5*s*), removing it from forward critical flip-flop delay path. Four scan select (ssb) gated master clocks are derived from clock input using ssb gated NAND (MC2) and NOR (MS1) gates. P-type transistor MP2 of clock NOR gate (MS1) is shared with clock inverter (MC1) p-type device MP1 to reduce input clock pin capacitance (pin-cap) and hence clock power overhead.

Out of four derived clocks, two clocks nc2 and nc3 are for data side of master latch and are connected to the forward path transmission gate (M3) and master keeper (M5). The other two clocks nc2s and nc3s are for the scan side of the master latch and are connected to scan tristate (M2s) and an additional master keeper (M5s). Since these clocks are gated by scan select ssb, merely one of the master clock pair is switching during normal or scan mode of operation, minimizing power overhead.

Data master clocks (nc2 and nc3) switch merely during normal mode of operation, while scan master clocks (nc2s and nc3s) switch merely during scan operation. One clock pair switching enables one master path. For example, one clock pair switching enables data side path during normal mode or bypass scan path during scan mode of operation, preserving flip-flop functionality. The scan topology of various embodiments is fully compatible with conventional simple Mux-D scan methodology. Since, scan Mux is bypassed to keeper side path, the design of various embodiments removes the scan Mux delay overhead in the convention Mux-D scan flip-flop. The fast Mux-D flip-flop critical data path is similar to LSSD scan flip-flop and hence results in similar high performance as LSSD flip-flop. Also, the number of scan input/output and scan clock are same as conventional Mux-D scan flip-flop.

In some embodiments, an apparatus is provided which comprises a master latch comprising a first data path and a second data path. The first data path comprises a scan path (e.g., electrical path that starts from input si) which is input into a memory circuitry of the master latch. The second data path is a non-scan path (e.g., data input path that starts at data input d) which is input via a transmission gate M3 coupled to the memory circuitry. In various embodiments, when the apparatus is a FF instead of a latch, the apparatus comprises a slave latch (e.g., circuitry to the right of inverter M4) coupled to the master latch (e.g., circuitry to the left of inverter M4).

In various embodiments, the apparatus comprises a first inverter M1 to receive input data d; and a second inverter M2 coupled in series with the first inverter M1 via node db. The second inverter is coupled to the transmission gate M3 through node dbd. The transmission gate M3 is controlled by nc3 and nc2, which are generated by scan select enable clock circuit 300/320.

In various embodiments, the memory circuitry comprises: a first tri-statable inverter M5s having an input dbdd coupled to the transmission gate M3; and a second tri-statable inverter M5 having an input sib coupled to an output of the first tri-statable M5s and the scan path. An output dbdd of the second tri-statable inverter is coupled to the transmission gate M3. The first tri-statable inverter M5s is controlled by nc3s and nc2s generated by circuit 300/320. The second tri-statable inverter M5 is controlled by nc2 and nc3 generated by circuit 300/320.

In various embodiments, the transmission gate M3 is a first transmission gate, wherein the slave latch is coupled to the master latch via inverter M4, and wherein the slave latch comprises a second transmission gate M6 coupled to an output dbddb of the inverter M4. Here, the memory circuitry is a first memory circuitry, wherein the slave latch comprises a second memory circuitry (comprising inverter M8 and tristate inverter M9) coupled to the second transmission gate M6. The second transmission gate M6 and tri-statable inverter M9 is controllable by clock clk and nc1 (which is generated by circuit 300/320).

In various embodiments, the scan path comprises a tri-statable inverter M2s with an input coupled to a scan input si and an output coupled to the input of the second tri-statable inverter M5. The tri-statable inverter M2s is controllable by nc2s and nc3s that are generated by circuit 300/320.

In various embodiments, the FF comprises circuitry 300/320 to generate scan select based gated clocks derived from input clock clk. The scan select based gated clocks are to: control the first transmission gate M3; control the first and second tri-statable inverters (M5s and M5) of the memory circuitry; and control the tri-statable inverter (M2s) of the scan path. As mentioned herein, circuitry 300/320 also control tri-statable inverter M9 and second transmission gate M6.

In some embodiments, circuitry 300/320 comprises an inverter MC1 having an input coupled to input clock clk, and an output nc1. Circuitry 300/320 also comprises AND logic 302 coupled to the output of the inverter MC1. The AND logic receives a scan select signal ssb as input. Circuitry 300/320 also comprises an OR logic 301 coupled to the input clk of the inverter MC1 and the output nc1 of inverter MC1, wherein the OR logic receives the scan select signal ssb as input.

Figure 5:
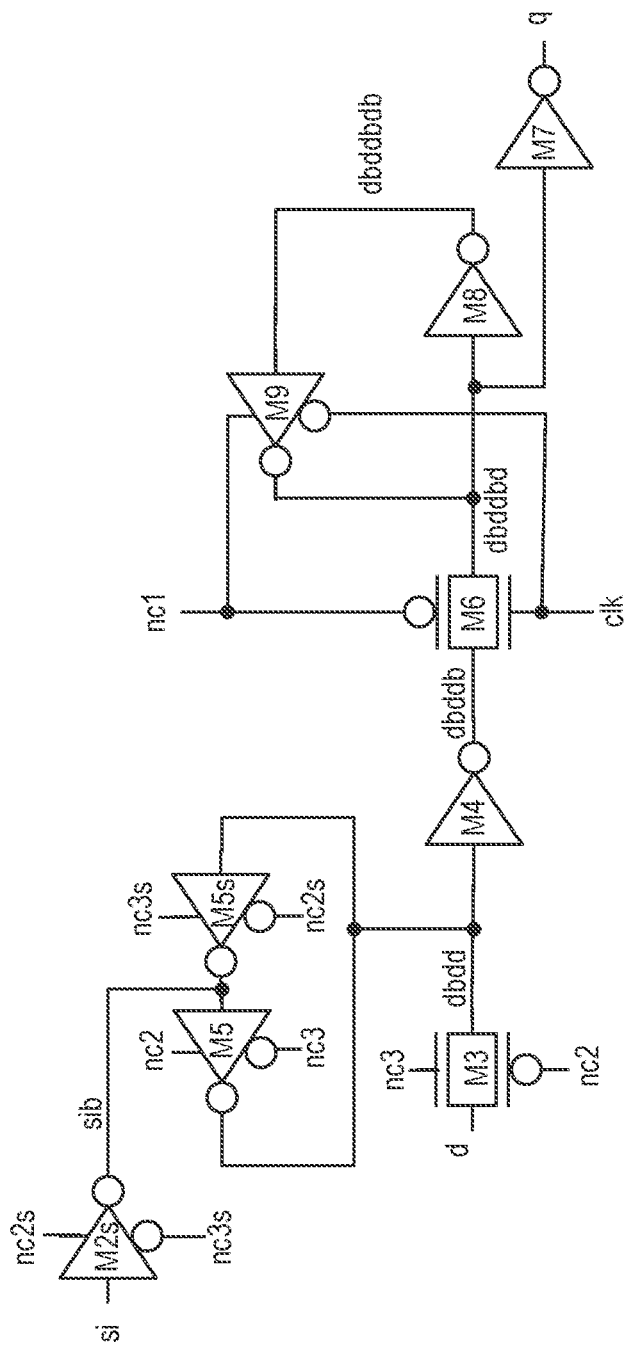
FIG. 5 illustrates a schematic of a bare pass-gate (BP) fast mux-D scan FF controlled by the scan enabled clock logic, in accordance with some embodiments.

FIG. 5 illustrates a schematic of a bare pass-gate (BP) fast mux-D scan FF 500 controlled by the scan enabled clock logic, in accordance with some embodiments. FF 500 is similar to FF 400 but for removal of input data inverters M1 and M2. By removing inverters M1 and M2, pass-gate M3 becomes bare pass-gate (BP). The fast mux-D FF of various embodiments (400 or 500) can be used in a critical timing path where high performing sequential are desired to meet the stringent timing requirements. However, the embodiments are not limited to such, and the fast Mux-D FF can be used in place of traditional FFs.

TABLE 1

| FF | Rise-to-Rise (au) | | | Fall-to-Fall (au) | | | Worst Case | | |
|---|---|---|---|---|---|---|---|---|---|
| | setup | Clk2q | BHT | Setup | Clk2q | BHT | Setup | Clk2q | BHT |
| Mux-D | 3.7 | 4.7 | 8.5 | 3 | 4.5 | 7.5 | 3.7 | 4.7 | 8.5 |
| Fast Mux-D | 3.2 | 4.1 | 7.3 | 1.4 | 4.3 | 5.6 | 3.2 | 4.3 | 7.5 |
| Fast Mux-D BP | 2.7 | 4.3 | 7.0 | 1.0 | 4.4 | 5.4 | 2.7 | 4.4 | 7.1 |

Table 1 shows a summary of the clk2Q (clock-to-output delay, setup and black hole time (BHT) delay for both rising edge and falling edge of the data. Fast Mux-D improves BHT for rising edge by 1.2 au (arbitrary units) and for falling edge by 1.9 au compared to conventional Mux-D scan flip-flop, achieving overall worst case BHT improvement by 1.0 au. Bare pass-gate (BP) fast Mux-D improves BHT for rising edge by 1.5 au and for falling edge by 2.1 au compared to conventional Mux-D scan flip-flop, achieving overall worst case BHT improvement by 1.4 au, for the same process technology node, temperature and supply voltage.

TABLE 2

| FF | Power | | |
|---|---|---|---|
| | 0% Data Activity | 25% Data Activity | 100% Data Activity |
| Mux-D | 0 | 0 | 0 |
| Fast Mux-D | +28% | +21% | +12% |
| Fast Mux-D BP | +22% | +13% | +2% |

Table 2 shows a summary of power overhead associated with fast Mux-D topology. This example shows that fast Mux-D and BP fast Mux-D results in 21% and 13% cell level power overhead compared to conventional Mux-D scan flip-flop at 20% data activity. This overhead can be reduced at block level by inserting fast Mux-D topology sparingly only in critical paths and using conventional Mux-D everywhere else in non-critical paths. Multi bit vectored flip-flop amortizes the power overhead associated with separate data and scan clock generations in fast Mux-D, across multiple flip-flops, reducing the cell level power overhead of fast Mux-D. For example, dual-bit version of BP fast Mux-D results in only 1% power overhead compared to conventional Mux-D flip-flop at 20% data activity.

In various embodiments, the inverters can be replaced with logic gates such as a NAND gate or NOR gate that are configured as inverters and can also be used to force a logic output using an enable signal (e.g., power saving mode). While some embodiments are illustrated with scan controllable multiplexer, the FF can be implemented without the scan controllable multiplexer.

Figure 6:
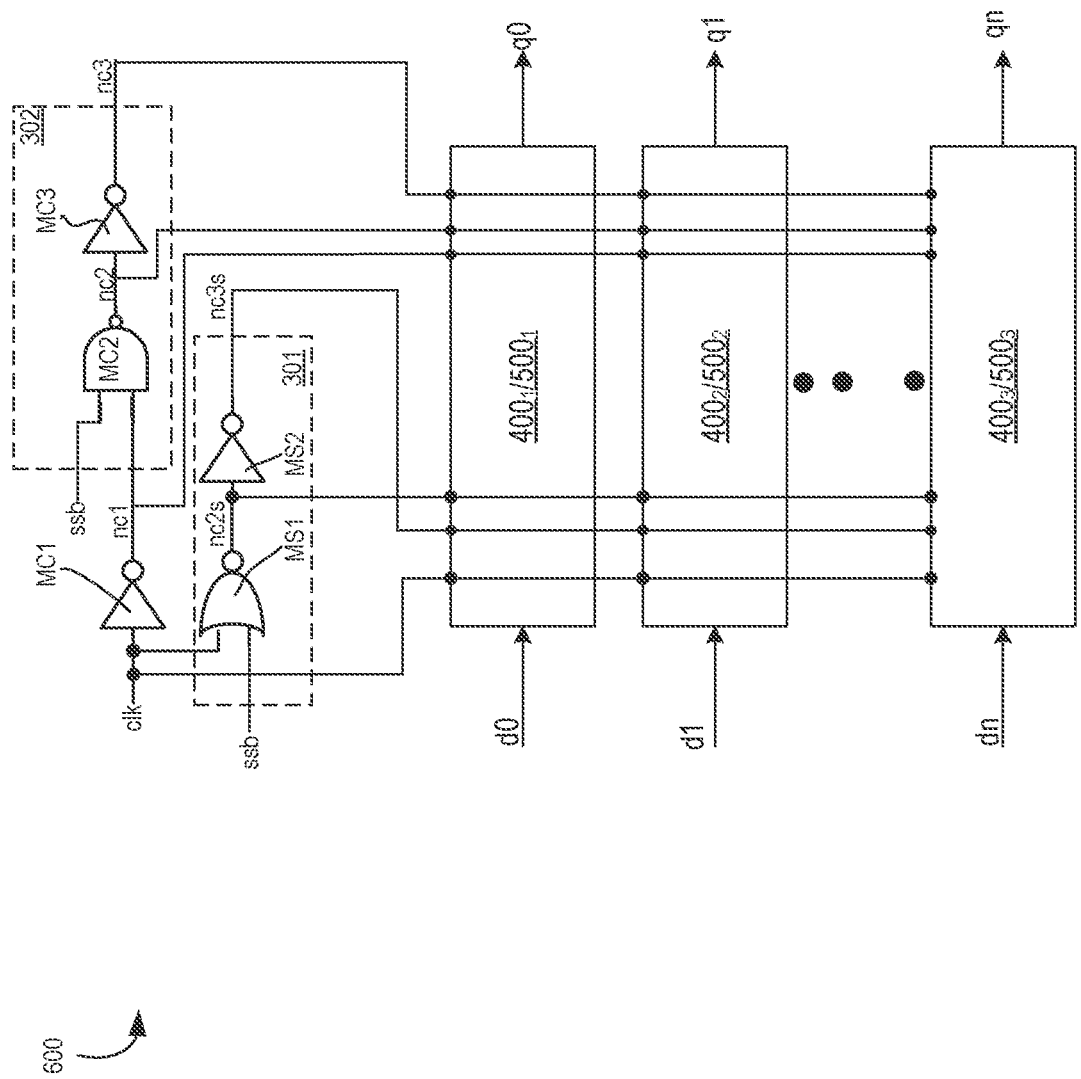
FIG. 6 illustrates a vectored fast Mux-D scan FF, in accordance with some embodiments.

FIG. 6 illustrates a vectored fast Mux-D scan FF 600, in accordance with some embodiments. In various embodiments, the scan controlled clocks nc2s, nc3s, nc2, nc3, and input clocks clk and nc1 are provided to 'n' number of FFs (e.g., $400_1$ through $400_n$, or $500_1$, through $500_n$). In this case, multiple data inputs d0 through dn are vectored to generate outputs q0 through qn with a shared scan enabled clock logic 300/320.

Figure 7:
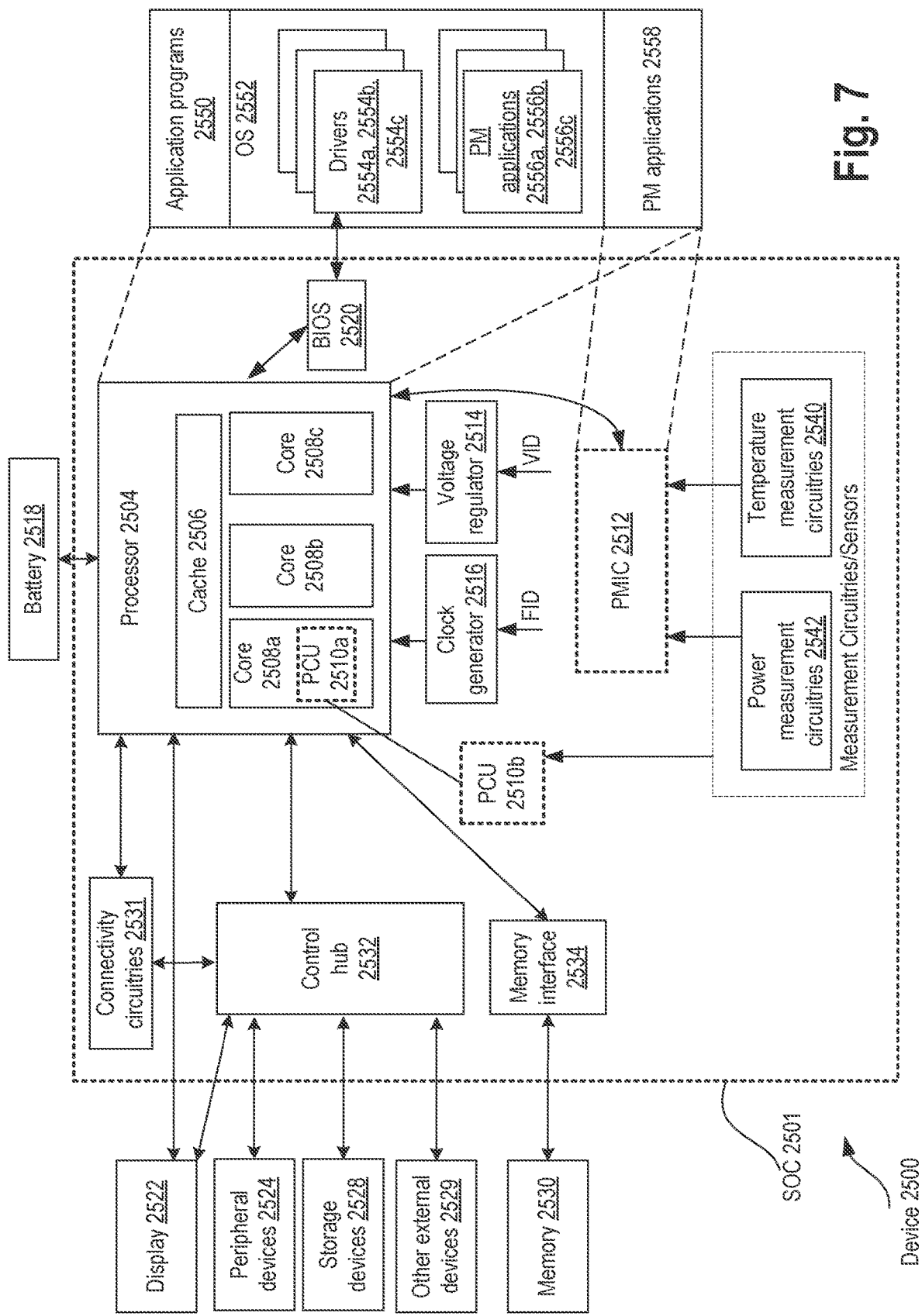
FIG. 7 illustrates a smart device, or a computer system, or a SoC (System-on-Chip) with high performance fast Mux-D scan flip-flop, according to some embodiments of the disclosure.

FIG. 7 illustrates a smart device, or a computer system, or a SoC (System-on-Chip) with high performance fast Mux-D scan flip-flop, according to some embodiments of the disclosure. In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here can have high performance fast Mux-D scan flip-flop. For example, any critical timing path can use the high performance fast Mux-D scan flip-flop.

In an example, the device 2500 comprises a SoC (System-on-Chip) 2501. An example boundary of the SOC 2501 is illustrated using dotted lines in FIG. 22, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508a, a second section of cache 2506 dedicated to core 2508b, and so on). In an example, one or more sections of cache 2506 may be shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions may be fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508a, 2508b, 2508c, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510a/b and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510a. In an example, some other sections of PCU 2510 may be implemented outside the processing cores 2508, and these sections of PCU 2510 are symbolically illustrated using a dotted box and labelled as PCU 2510b. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556*a*, 2556*b*, 2556*c*. The OS 2552 may also include various drivers 2554*a*, 2554*b*, 2554*c*, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a master latch comprising a first data path and a second data path, wherein the first data path comprises a scan path which is input into a memory circuitry of the master latch, and wherein the second data path is a non-scan path which is input via a transmission gate coupled to the memory circuitry; and a slave latch coupled to the master latch.

Example 2: The apparatus of example 1 comprising: a first inverter to receive an input data; and a second inverter coupled in series with the first inverter, wherein the second inverter is coupled to the transmission gate.

Example 3: The apparatus of example 1, wherein the memory circuitry comprises: a first tri-statable inverter having an input coupled to the transmission gate; and a second tri-statable inverter having an input coupled to an output of the first tri-statable and the scan path, wherein an output of the second tri-statable inverter is coupled to the transmission gate.

Example 4: The apparatus of example 3, wherein the transmission gate is a first transmission gate, wherein the slave latch is coupled to the master latch via an inverter, and wherein the slave latch comprises a second transmission gate coupled to an output of the inverter.

Example 5: The apparatus of example 4, wherein the memory circuitry is a first memory circuitry, wherein the slave latch comprises a second memory circuitry coupled to the second transmission gate.

Example 6: The apparatus of example 4, wherein the scan path comprises a tri-statable inverter with an input coupled to a scan input and an output coupled to the input of the second tri-statable inverter.

Example 7: The apparatus of example 6 comprises circuitry to generate scan select based gated clocks derived from an input clock, wherein the scan select based gated clocks are to: control the first transmission gate; control the first and second tri-statable inverters of the memory circuitry; and control the tri-statable inverter of the scan path.

Example 8: The apparatus of example 6, wherein the circuitry comprises: an inverter having an input coupled to an input clock, and an output; an AND logic coupled to the output of the inverter, wherein the AND logic is to receive a scan select signal as input; and an OR logic coupled to the input of the inverter, wherein the OR logic is to receive the scan select signal as input.

Example 9: The apparatus of example 1, wherein a data input is directly received by the transmission gate without intervening buffers or inverters.

Example 10: An apparatus comprising: circuitry to generate scan select based gated clocks derived from an input clock; and a vectored flip-flop circuitry to receive scan select based gated clocks from the circuitry, wherein a flip-flop of the vectored flip-flop circuitry comprises: a master latch comprising a first data path and a second data path, wherein the first data path comprises a scan path which is input into a memory circuitry of the master latch, and wherein the second data path is a non-scan path which is input via a transmission gate coupled to the memory circuitry; and a slave latch coupled to the master latch.

Example 11: The apparatus of example 10, wherein the flip-flop of the vectored flip-flop circuitry comprises: a first inverter to receive an input data; and a second inverter coupled in series with the first inverter, wherein the second inverter is coupled to the transmission gate.

Example 12: The apparatus of example 10, wherein the memory circuitry comprises: a first tri-statable inverter having an input coupled to the transmission gate; and a second tri-statable inverter having an input coupled to an output of the first tri-statable and the scan path, wherein an output of the second tri-statable inverter is coupled to the transmission gate.

Example 13: The apparatus of example 12, wherein the transmission gate is a first transmission gate, wherein the slave latch is coupled to the master latch via an inverter, wherein the slave latch comprises a second transmission gate coupled to an output of the inverter.

Example 14: The apparatus of example 13, wherein the memory circuitry is a first memory circuitry, wherein the slave latch comprises a second memory circuitry coupled to the second transmission gate.

Example 15: The apparatus of example 13, wherein the scan path comprises a tri-statable inverter with an input coupled to a scan input and an output coupled to the input of the second tri-statable inverter.

Example 16: The apparatus of example 15, wherein the scan select based gated clocks are to: control the first transmission gate; control the first and second tri-statable inverters of the memory circuitry; and control the tri-statable inverter of the scan path.

Example 17: The apparatus of example 15, wherein the circuitry comprises: an inverter having an input coupled to an input clock, and an output; an AND logic coupled to the output of the inverter, wherein the AND logic is to receive a scan select signal as input; and an OR logic coupled to the input of the inverter, wherein the OR logic is to receive the scan select signal as input.

Example 18: The apparatus of example 10, wherein a data input is directly received by the transmission gate without intervening buffers or inverters, and wherein the scan select based gated clocks are to: control the first transmission gate; control the first and second tri-statable inverters of the memory circuitry; and control the tri-statable inverter of the scan path.

Example 19: A system comprising: a memory; a processor coupled to the memory, wherein the processor includes a critical timing path which includes a flip-flop comprising: a master latch comprising a first data path and a second data path, wherein the first data path comprises a scan path which is input into a memory circuitry of the master latch, and wherein the second data path is a non-scan path which is input via a transmission gate coupled to the memory circuitry; and a slave latch coupled to the master latch; and a wireless interface to allow the processor to communicate with another device.

Example 20: The system of example 19 comprising: a first inverter to receive an input data; and a second inverter coupled in series with the first inverter, wherein the second inverter is coupled to the transmission gate.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a latch that includes a data path and a scan path, wherein the latch includes:
a transmission gate coupled on the data path between a data input and a keeper node; and
a memory circuitry coupled to the keeper node, wherein the scan path is coupled to the memory circuitry, wherein the memory circuitry includes:
a first tri-statable inverter having an input coupled to the keeper node; and
a second tri-statable inverter having an input coupled to an output of the first tri-statable inverter and the scan path, wherein an output of the second tri-statable inverter is coupled to the keeper node; and
scan clock circuitry to generate scan clock signals for a scan mode of the latch, the scan clock circuitry comprising:
an inverter having an input and an output, wherein an input of the inverter is to receive an input clock;
an AND logic coupled to the output of the inverter, wherein the AND logic is to receive a scan select signal; and
an OR logic coupled to the input of the inverter, wherein the OR logic is to receive the scan select signal.

2. The apparatus of claim 1, wherein the scan path includes a third tri-statable inverter with an input coupled to a scan input and an output coupled to the input of the second tri-statable inverter.

3. The apparatus of claim 2, wherein the scan clock signals are to control the first, second, and third tri-statable inverters.

4. The apparatus of claim 3, wherein the scan clock signals are further to control the transmission gate.

5. The apparatus of claim 1, wherein the latch is a primary latch, and wherein the apparatus further comprises a secondary latch coupled to the primary latch.

6. The apparatus of claim 5, wherein the inverter is a first inverter, and wherein the apparatus further comprises a second inverter coupled between the keeper node and an input of the secondary latch.

7. The apparatus of claim 1, wherein the inverter is a first inverter, and wherein the data path includes:
a second inverter to receive an input data; and
a third inverter coupled in series with the second inverter, wherein the third inverter is coupled to the transmission gate.

8. The apparatus of claim 1, wherein the transmission gate is to directly receive a data input without intervening buffers or inverters.

9. An apparatus comprising:
a primary latch that includes:
a data path and a scan path;
a transmission gate coupled on the data path between a data input and a keeper node;
a memory circuitry coupled to the keeper node, wherein the scan path is coupled to the memory circuitry; and
a tri-statable inverter on the scan path with an input coupled to a scan input and an output coupled to the memory circuitry;
a first inverter with an input coupled to the keeper node;
a secondary latch with an input coupled to an output of the inverter; and
scan clock circuitry to generate scan clock signals to control the transmission gate, the memory circuitry, and the tri-statable inverter for a scan mode of the apparatus, wherein the scan clock circuitry includes:
a second inverter having an input and an output, wherein an input of the second inverter is to receive an input clock;
an AND logic coupled to the output of the second inverter, wherein the AND logic is to receive a scan select signal; and
an OR logic coupled to the input of the second inverter, wherein the OR logic is to receive the scan select signal.

10. The apparatus of claim 9, wherein the tri-statable inverter is a first tri-statable inverter, and wherein the memory circuitry includes:
a second tri-statable inverter having an input coupled to the keeper node; and
a third tri-statable inverter having an input coupled to an output of the first tri-statable inverter and the scan path, wherein an output of the third tri-statable inverter is coupled to the keeper node, and wherein the scan clock signals are to control the second and third tri-statable inverters.

11. The apparatus of claim 10, wherein the output of the first tri-statable inverter is coupled to the input of the third tri-statable inverter.

12. The apparatus of claim 9, wherein the inverter is a first inverter, and wherein the data path includes:
a second inverter to receive an input data; and
a third inverter coupled in series with the second inverter, wherein the third inverter is coupled to the transmission gate.

13. The apparatus of claim 9, wherein the transmission gate is to directly receive a data input without intervening buffers or inverters.

14. A system comprising:
a wireless communication interface;
a memory; and
a processor coupled to the memory and the wireless communication interface, the processor having a flip-flop that includes:
a primary latch that includes a data path and a scan path, wherein the primary latch includes:
a transmission gate coupled on the data path between a data input and a keeper node; and
a memory circuitry coupled to the keeper node, wherein the scan path is coupled to the memory circuitry, wherein the memory circuitry includes:
a first tri-statable inverter having an input coupled to the keeper node; and
a second tri-statable inverter having an input coupled to an output of the first tri-statable inverter and the scan path, wherein an output of the second tri-statable inverter is coupled to the keeper node;
a secondary latch coupled to an output of the primary latch; and
scan clock circuitry to generate scan clock signals to control the primary latch, wherein the scan clock circuitry includes:

an inverter having an input and an output, wherein an input of the inverter is to receive an input clock;

an AND logic coupled to the output of the inverter, wherein the AND logic is to receive a scan select signal; and an OR logic coupled to the input of the inverter, wherein the OR logic is to receive the scan select signal.

15. The system of claim 14, wherein the scan path includes a third tri-statable inverter with an input coupled to a scan input and an output coupled to the input of the second tri-statable inverter.

16. The system of claim 15, wherein the scan clock signals are to control the first, second, and third tri-statable inverters.

17. The system of claim 16, wherein the scan clock signals are further to control the transmission gate.

* * * * *